United States Patent [19]

Winkle

[11] Patent Number: 5,650,261
[45] Date of Patent: Jul. 22, 1997

[54] POSITIVE ACTING PHOTORESIST COMPRISING A PHOTOACID, A PHOTOBASE AND A FILM FORMING ACID-HARDENING RESIN SYSTEM

[75] Inventor: Mark Robert Winkle, Lansdale, Pa.

[73] Assignee: Rohm and Haas Company, Philadelphia, Pa.

[21] Appl. No.: 428,820

[22] Filed: Oct. 27, 1989

[51] Int. Cl.$^6$ .......................... G03F 7/012; G03F 7/023; G03F 7/38

[52] U.S. Cl. .................. 430/270.1; 430/176; 430/192; 430/194; 430/196; 430/197; 430/326; 430/328; 430/330

[58] Field of Search .................. 430/270.1, 326, 430/330, 328, 176, 194, 195, 196, 197, 192

[56] References Cited

U.S. PATENT DOCUMENTS

| | | | |
|---|---|---|---|
| 3,779,758 | 12/1973 | Polichette | 430/176 |
| 4,343,885 | 8/1982 | Reardon, Jr. | 430/270 |
| 4,737,438 | 4/1988 | Ito et al. | 430/197 |
| 4,775,609 | 10/1988 | McFarland | 430/270 |
| 4,777,115 | 10/1988 | Koch et al. | 430/281 |
| 4,797,348 | 1/1989 | Nakamura et al. | 430/197 |
| 5,084,372 | 1/1992 | Hsieh et al. | 430/191 |

*Primary Examiner*—John S. Y. Chu
*Attorney, Agent, or Firm*—James G. Vouros

[57] ABSTRACT

A positive-acting photoresist composition which produces crosslinked images and processes for using the photoresist composition are disclosed. The photoresist composition is prepared from a mixture containing a film forming, polymer-containing, acid hardening resin system, an acid or acid generating material (preferably in the form of a thermal acid generator) for crosslinking the acid hardening resin system, and a photobase generating compound. The photoresist composition is applied as a film onto a substrate surface and selectively imagewise exposed through a photomask to actinic radiation. The actinic radiation causes the photobase generator to produce a base in the imagewise exposed portions of the photoresist film. The photochemically generated base neutralizes the acid in the imagewise exposed areas of the photoresist film. The non-imagewise exposed portions of the photoresist film, not containing the photochemically generated base, are crosslinked by the catalytic action of the acid upon heating the film, and the imagewise exposed portions of the photoresist film are removed from the substrate by the action of a developer solution leaving a crosslinked positive image on the substrate. In an alternate embodiment the photoresist composition may be applied to conductive substrate surfaces by electrodeposition.

3 Claims, No Drawings

POSITIVE ACTING PHOTORESIST COMPRISING A PHOTOACID, A PHOTOBASE AND A FILM FORMING ACID-HARDENING RESIN SYSTEM

FIELD OF THE INVENTION

This invention is directed to an improved acid hardening photoresist composition useful for the formation of positive crosslinked images on substrate surfaces such as for example for use in the preparation of integrated circuits and printed circuit boards. More particularly, the invention is directed to a positive-acting photoresist composition which employs acid hardening technology in conjunction with a photobase generator. The selection of the photobase generator for neutralizing the acid, present in the non-imagewise exposed portions of the photoresist film, in combination with the ability of the acid to crosslink the photoresist film, in the portions of the film not containing the photochemically generated base, upon heating the film forms crosslinked positive images on substrate surfaces.

BACKGROUND OF THE INVENTION

This invention is related to previous disclosures such as European Patent Application 85303807.3, Publication No. 0 164 248 directed to acid hardening resin containing photoresist compositions and processes for their use, as well as generally to conventional positive acting photoresist compositions.

A positive acting photoresist is a film forming composition which typically contains a film forming polymer and a photosensitive compound dissolved in a suitable solvent. The photoresist composition is applied to a substrate surface, such as for example the surface of a silicon wafer in the preparation of an integrated circuit or computer chip, as a film. A photomask is positioned between the substrate surface containing the photoresist film and a source of exposing radiation. The photomask acts like a stencil having portions which are transparent to the exposing radiation to be used and other portions which are opaque to the exposing radiation. The photomask is designed and fabricated to duplicate the electronic circuit pattern which is desired to be transferred onto the substrate. The exposing radiation to be employed is typically radiation of a single or narrow range of wavelengths, referred to as actinic radiation, in the ultraviolet or shorter wavelength spectra, such as for example x-rays and electron beams. The photoresist film is exposed to the selected exposing radiation at a predetermined dosage and time through the photomask. Through the proper positioning of the photomask relative to the photoresist film only those portions of the photoresist film juxtaposed to the transparent portions of the photomask are exposed to the actinic radiation. The exposing radiation absorbed by the photoactive compound in the photoresist film causes a chemical reaction in the exposed portions of the film. In the case of a positive acting photoresist this chemical reaction renders the exposed portions of the photoresist film more soluble than the unexposed portions of the film to certain selected solutions known as developers. This differential solubility between the exposed portions and unexposed portions of the photoresist film to such developers permits the selective removal of the exposed portions in a development step thereby leaving the unexposed portions of the photoresist film on the substrate. This creates a pattern for the subsequent deposition of a conductive metal, insulators or dopants, or for etching the substrate, in the portions of the substrate not protected by the remaining photoresist portions. These remaining photoresist portions are removed from the substrate after the deposition of the conductive metal circuitry by stripping the photoresist using selected stripping solvents.

In the above described process it is desirable for a positive photoresist to possess as wide a differential solubility as possible between the exposed and unexposed portions of the film as well as the ability of the unexposed portions to be as resistant as possible to the subsequent chemicals and conditions used in the subsequent processing.

In the case of negative acting photoresist compositions the development step selectively removes the unexposed portions of the photoresist film leaving the exposed portions of the photoresist film on the substrate. Accordingly if one desires to produce the same circuit pattern on a substrate using a negative acting photoresist composition as described above as with a positive acting photoresist composition generally the type of photosensitive compound, the process and the photomask need to be modified. In the case of the photomask the portions of the positive photomask which are transparent to the exposing radiation need to be made non transparent or opaque to the exposing radiation and those portions of the positive photomask which are opaque to the exposing radiation need to be transparent to the exposing radiation. Similarly the photosensitive compound used in the photoresist composition needs to be selected such that the exposed portions of the photoresist film are less soluble in the selected developer solution than the unexposed photoresist film portions.

At the present time the majority of the high resolution commercial photoresist compositions are based on positive acting chemistry and processes, although recent advances in the application of acid hardening chemistry to high resolution photoresists has spurred renewed interest in negative acting photoresists. Acid hardening chemistry in negative acting photoresists offers the advantage of creating high resolution, crosslinked polymeric images on substrates. These crosslinked images not only offer improved chemical and thermal resistance during subsequent processing of the substrate, but due to the increased differential solubility between the exposed and unexposed photoresist film portions permit wider processing latitude for the development step.

Acid hardening chemistry employs the combination of an acid hardening resin system and an acid which catalyzes the crosslinking of the acid hardening resin system in the photoresist when the photoresist film is heated.

DESCRIPTION OF THE PRIOR ART

Photoresist compositions utilizing polymeric resin systems and photosensitizers are known in the art.

U.S. Pat. No. 3,201,239 discloses the combination of a thermoplastic, phenolformaldehyde novolak resin with a naphthoquinone diazide or naphtho-quinone diazide sulfonic acid ester photosensitizer as a positive acting coating.

U.S. Pat. No. 3,692,560 discloses using an acid hardening resin such as urea and melamine resins with photoacid generating halogen substituted benzophenones. These photoacid generators when exposed to ultraviolet light produce strongly acidic hydrogen halides that catalyze the formation of a negative, organic solvent developable, images.

U.S. Pat. No. 3,697,274 discloses the preparation of printing plates using a negative resist system containing an acid curable resin and an organic halogen compound. The process requires the imagewise exposure and heating of the film and the removal of the unexposed areas using an organic solvent developer.

U.S. Pat. No. 3,402,044 discloses a photosensitive coating for printing plates containing a naphthoquinone diazide sulfonic acid sensitizer and an alkali-soluble phenol or cresol-formaldehyde novolak resin capable of being developed with an aqueous base solution. This positive resist system is thermoplastic and does not further polymerize on baking. The images formed are thermally unstable at temperatures in the range of about 100 to about 150° C.

U.S. Pat. No. 3,666,473 is directed to an aqueous base developable thermoplastic positive resist utilizing a mixture of a novolak resin and a resol resin with conventional photosensitizer. The mixture of these resins, having different aqueous base solubilities, is taught to increase the photospeed of the resist.

U.S. Pat. No. 3,759,711 describes an aqueous base developable photosensitive coating for graphic arts application employing a phenol-formaldehyde novolak or resol resin with a polymeric photosensitive compound in which quinone diazide groups are linked to the polymer backbone through nitrogen atoms. This patent expressly warns against heating the resins to cause them to harden in a non-imagewise manner.

U.S. Pat. No. 3,890,152 discloses a dual acting resist utilizing a positive acting o-quinone diazide photosensitizer and a negative diazonium salt in combination with a variety or resins. Positive images are developed using an aqueous base and negative images are developed using an aqueous acid. Reexposure of the positive image after development is taught to harden the image.

U.S. Pat. No. 4,007,047 is also directed to a dual acting resist in which after the resist is exposed to form an aqueous base soluble positive image, the film is treated with a solution containing hydrogen ions to decrease the aqueous base solubility of the exposed areas. The entire resist can then be re-exposed forming an aqueous base developable negative image. The resist is formed from an alkali-soluble phenol-formaldehyde resin and a naphthoquinone diazide sulfonic acid ester sensitizer. This patent also discloses a method for forming a negative image starting with a positive resist containing a thermoplastic, phenol-formaldehyde novolak resin, and a naphthoquinone sensitizer. Exposure and development leads to a positive image while alternatively, heating the resist in an acid solution renders the exposed areas insoluble in an aqueous base. Re-exposure of the entire resist followed by aqueous base development leads to a negative image.

U.S. Pat. No. 4,115,128 discloses a positive resist containing an o-naphthoquinone diazide sensitizer, an alkali soluble phenolic resin, and 1 to 5 weight percent of an organic acid cyclic anhydride. The cyclic anhydride is taught to increase the photospeed of the resist.

U.S. Pat. No. 4,196,003 is directed to a dual acting photosensitive copying layer containing an o-quinone diazide, a thermoplastic phenol-formaldehyde or cresol-formaldehyde resin, and a secondary or tertiary amine. Heat treatment of the exposed resist is taught to accelerate the aqueous base insolubilization of the exposed areas. The '003 patent discloses tertiary cyclic amines, such as hexamethylenetetramine, as being suitable tertiary amines. In addition to causing the exposed resist to become insoluble in aqueous base upon heating, the tertiary cyclic amine also has been found to crosslink the resin.

U.S. Pat. No. 4,356,254 is also directed to a dual acting resist in which a basic carbonium ion dye acts to insolubilize the exposed areas of the resist.

U.S. Pat. No. 4,356,255 discloses a dual acting resist using a quinone diazide sensitizer and a quinone or aromatic ketone. As in the other prior art dual acting systems, the exposed areas are rendered insoluble in an aqueous base.

British Patent 1,494,640 is also directed to a dual acting resist relying on a similar mechanism in which a compound containing a hydroxy group, such as a hydroxy-containing novolak, Bisphenol-A, pyrogallol and triethanolamines.

Other references disclosing thermally stable positive resists, based on completely different resin systems and chemical mechanisms from the present invention, include U.S. Pat. No. 4,339,521; 4,395,482; 4,404,357 and 4,424,315.

European Patent Application 85303807.3, Publication No. 0 164 248 discloses a photoresist composition containing an acid hardening resin system and a photoacid generator. By manipulating the processing sequence this photoresist composition may be used to produce either crosslinked positive or negative images.

European Patent application 87300220.8, Publication No. 0 232 973 discloses the use of negative acting photosensitive polymeric compositions as described in EPA85303807.3 for preparing three dimensional crosslinked microplastic structures. European Patent Application 87300219.0, Publication No. 0 232 972, discloses negative acting photoresist compositions employing acid hardening resin chemistry and selected photoacid generators for use in preparing crosslinked images of micron and submicron resolution with short wavelength exposing actinic radiation in the deep ultraviolet, x-ray and electron beam spectrum.

U.S. Pat. No. 4,592,816 is also relevant to the present invention. This patent discloses a negative acting photosensitive polymer composition which can be electrophoretically deposited onto a conductive surface. The photo-sensitive polymer composition is formed from an aqueous solution or emulsion of at least one film forming polymer, free of ethylenic unsaturation, containing charged carrier groups, a photoinitiator and an unsaturated crosslinking monomer. Polymers containing such carrier groups useful in that invention include acrylic polymers, epoxy polymers, polyurethanes, polyesters and polyamides. The positively charged carrier groups which are attached to the polymer for cataphoretic electrodeposition include protonated quaternary ammonium groups, sulfonium groups and sulfoxonium groups. Negatively charged carrier groups for anaphoretic electrodeposition include carboxylic acid groups. The photosensitive polymeric composition contains a photoinitiator which will polymerize the unsaturated groups in the crosslinking monomer when the photoresist film is exposed to actinic radiation. Suitable photoinitiators are disclosed in the '816 patent in column 10, line 40 to column 11, line 20.

British Patent 1,330,100 discloses a positive photoresist containing an epoxy, an amine curing agent and a halogenated polycarboxylic acid anhydride. Imagewise exposure produces acid in the exposed portions of the film, which acid is neutralized by the amine curing agent. Heating the film selectively crosslinks the unexposed portions. The exposed portions are removed by development using a halogenated hydrocarbon solvent.

Other relevant publications relating to acid hardening technology include:

*Aqueous Base Developed, Single Level Resist for Submicron X-Ray Lithography*, SPIE- Vol. 773, Electron-Beam, X-Ray, and Ion-Beam Lithographies VI, 5–6 March 1987, Santa Clara, Calif., E. Tai, B. Fay, C. M. Stein and W. Feely.

*Microplastic Structures*, SPIE—Vol. 631, Advances in Resist Technology and Processing III 10–11 March 1986, Santa Clara, Calif., W. E. Feely, Rohm and Haas Co.

*The Role of the Latent Image in a New Dual Image, Aqueous Developable, Thermally Stable Photoresist*, Polymer Engineering and Science, Mid-September, 1986 Vol. 26, No. 16, W. E. Feely, J. C. Imhof, and C. M. Stein, Rohm and Haas Company.

*Characterization of a High Resolution Novolak Based Negative E-Beam Resist with 4 uC/cm$^2$ Sensitivity*, J. Vac. Science of Technology, B, H. Y. Liu, Hewlett Packard Co., M. P. deGranpre & W. E. Feely, Rohm and Haas Co., 1988 Vol. 6, No.1,379–83.

*3-D Latent Image in an Acid Hardening Resin* W. E. Feely, Rohm and Haas Company.

*Micro-Structures* W. E. Feely, Rohm and Haas Company.

*A Negative, Deep-UV Resist for 248 nm Lithography*, J. Electro-Chemical Society, M. M. O'Toole, Hewlett Packard Co.; M.P. deGrandpre & W. E. Feely, Rohm and Haas Co. 1988, Vol. 135 No. (4).

*High Resolution, Novolak Based Negative Tone Electron Beam Resist*. pp 1558–163 (1988), M. deGrandpre, K. Graziano, S. D. Thompson, Rohm and Haas Co.; H. Y. Liu, Hewlett Packard; L. Blum, Shipley Co Spie—Vol. 923 Electron-Beam, X-Ray, and Ion-Beam Technology: Submicrometer Lithographies VII.

*Processing Photostructural Materials*, pp 160–166, (1987), D. J. Rosenblatt and J. N. Zemel, Univ. of Penna.; W. E. Feely, Rohm and Haas Co Spie—Vol. 923 Electron-Beam, X-Ray, and Ion-Beam Technology: Submicrometer Lithographies VII.

*Studying of Aging Effects in a Chemical Amplification Resist*: SAL601-ER7, May 3–Jun. 2, 1989, H. Y. Liu, J. Seeger & E. Poon, Hewlett Packard Co.; R. J. Olsen, K. A. Graziano & S. E Anderson, Rohm and Haas Co, EIPB—33rd International Symposium on Electron, Ion and Photon Beams.

It is an object of the present invention to provide a positive acting photoresist composition which produces crosslinked images.

It is also an object of the present invention to provide a positive acting photoresist composition which may be applied to a conductive surface by electrodeposition.

SUMMARY OF THE INVENTION

A positive-acting photoresist composition which produces crosslinked images and processes for using the photoresist composition am provided. The photoresist composition is a mixture containing at least one film forming polymer-containing, acid hardening resin system, an acid or acid generating material (preferably in the form of a thermal acid generator) for crosslinking the acid hardening resin system, and a photobase generating compound.

The photoresist composition is applied onto a substrate surface to form a photoresist film. Portions of the photoresist film are then imagewise exposed to actinic radiation. "Imagewise" exposure, as used herein, refers to the step of selectively exposing portions of the photoresist film to actinic radiation, as through a photomask, to create an image pattern in the exposed film portions, such that this image pattern substantially corresponds to the desired final image pattern to be transferred onto the substrate. The actinic radiation used in the imagewise exposure step causes the photobase generator in the photoresist film to produce a base in the exposed portions of the photoresist film. The acid present in the imagewise exposed portions of the film is thus neutralized by the photochemically generated base. The unexposed portions of the photoresist film (those portions of the film which contain the acid but do not contain the photochemically generated base) are crosslinked by the reaction of the unneutralized acid with the acid hardening resin system upon heating the film. The imagewise exposed portions of the photoresist film are then removed by the action of a developer solution thereby leaving a crosslinked positive image on the substrate.

In an alternate embodiment of the invention the photoresist composition may be applied to conductive substrate surfaces by electrodeposition.

Additional objects and features of this invention will become more readily apparent from the detailed description and examples which follow.

DETAILED DESCRIPTION OF THE INVENTION

The photoresist composition of the invention is a mixture containing at least one film forming, polymer-containing, acid hardening resin system, an acid or acid generating compound, and a photobase generator.

The film forming acid hardening resin system contains at least one film forming polymer and at least one compound which crosslinks the film forming polymer in the presence of an acid catalyst and heat. Alternatively, the film forming polymer or polymer mixture can include one or more polymers containing pendant acid catalyzable crosslinking functionality, and in such cases there is no requirement for a separate crosslinker compound. Typically, the film forming polymer or polymer mixture does not contain self crosslinking functionality, and may be any polymer or polymer mixture which forms a film at ambient temperatures, provided however, that the polymer, or at least one polymer in the polymer mixture, contains a plurality of hydroxy, carboxyl, amide or imide groups. Suitable film forming polymers include those film forming polymers which contain reactive hydrogen-containing groups such as for example: novolak resins; polyvinylphenols; polyglutarimides; polyacrylic acid or polymethacrylic acid copolymers; alkali-soluble polyacrylamides and polymethacrylamide copolymers; copolymers containing 2-hydroxyethyl acrylate and methacrylate; and polyvinyl alcohols such as those prepared from partially hydrolyzed polyvinyl acetates; alkali-soluble styrene-allyl alcohol copolymers; and mixtures thereof.

Preferred film forming polymers are acrylic polymers, epoxy polymers, polyurethanes, polyesters and polyamides, and more preferably, in the electrodeposition embodiment of the invention, (meth)acrylate copolymers containing either, or both, pendant hydroxyl and carboxyl groups. Preferred monomers useful for preparing the film forming polymer include acrylic and methacrylic acid, lower alkyl (C1–C8) esters of (meth)acrylic acid and hydroxy-substituted (meth)acrylates such as for example 2-hydroxyethyl acrylate, and 2-hydroxyethyl methacrylate.

Other vinyl monomers containing pendant carrier groups may be polymerized with acrylic and methacrylic monomers to incorporate pendant carrier groups onto the polymer backbone for electrodeposition of the photoresist composition. These vinyl comonomers include for example styrene and substituted styrene, vinyl halides such as vinyl chloride, vinyl esters such as vinyl acetate, and vinyl ethers such as methyl vinyl ether, and the like used alone or in combination.

The polymer or polymer mixture should preferably have a sufficiently low glass transition temperature (Tg) so that the photoresist composition form films at ambient temperatures. The Tg of the polymer or polymer mixture typically will be below about 25 degrees Celsius, but may be higher than 25 degrees Celsius if the polymer or polymer mixture is blended with solvents, plasticizers or coalescents, to cause resulting photoresist composition to form a film at ambient temperature.

The polymer or polymers should have a weight average molecular weight in the range of from about 3,000 to about 200,000. Polymers having a weight average molecular weight less than about 100,000 are preferred, and when the photoresist composition is to be applied electrophoretically onto a conductive substrate surface, the weight average molecular weight of the polymer should preferably be in the range of from about 5,000 to about 100,000, and more preferably in the range of from about 10,000 to about 80,000 weight average molecular weight.

In the case where the acid hardening resin system contains a polymer with crosslinking functionality such polymers may include: polymers with pendant epoxy groups; vinyl polymers prepared by the copolymerization of N-(alkoxymethyl) acrylamide or methacrylamide, and copolymers of vinylphenol and (acetoxymethyl) styrene as described in *Photocrosslinking Based on Electrophilic Aromatic Substitution and its Application to Resists Incorporating Chemical Amplification*, Polym. Mater. Sci. Eng., J. M. J. Frechet, S. Matuszczak, B. Beck, and C. G. Willson, 1989, Vol. 60, 147–50.

If the film forming polymer does not contain acid catalyzable self-crosslinking functionality, the acid hardening resin system requires at least one compound, hereinafter referred to as "a crosslinker or crosslinkers", which will react or crosslink with the film forming polymer or polymer mixture in the presence of an acid catalyst and heat. Suitable crosslinkers for use in the photoresist composition of the invention include aminoplasts and phenoplasts. Suitable aminoplast resins include for example urea-formaldehyde, melamine-formaldehyde, benzoguanamine-formaldehyde, glycoluril-formaldehyde resins and combinations thereof. Polymeric aminoplasts may be prepared by the reaction of acrylamide or methacrylamide or methacrylamide copolymers with formaldehyde in an alcohol-containing solution, or alternatively by the copolymerization of N-(alkoxymethyl) acrylamide or methacrylamide with other suitable monomers. Examples of some suitable aminoplasts include the melamine resins manufactured by American Cyanamid Company such as Cymel$^R$ 300, 301, 303, 350, 370, 380, 1116 and 1130; benzoguanamine resins such as Cymel 1123 and 1125; glycoluril resin Cymel 1170; and urea-based resins Beetle$^R$ 60, 65, and 80. A large number of similar aminoplasts are presently available from various suppliers. These resins may be purified to remove trace amounts of impurities as by subsequent distillation. A preferred, purified aminoplast is hexamethyl methoxy melamine as disclosed in copending U.S. patent application Ser. No. 376,713, which is hereby incorporated by reference herein.

The photoresist composition must contain an effective amount of an acid to catalyze the acid hardening crosslinking reaction in portions of the photoresist film. I have found that the photoresist composition may employ either a strong acid, such as for example a sulfonic acid, or a weak acid, such as for example, lactic acid, or at least one neutral compound which produces an effective amount of acid when required. Strong acids are preferred if the photoresist composition is to be applied by electrodeposition. Since the acid may cause some minor degree of crosslinking at ambient temperatures I have found it preferable to extend the shelf life of the photoresist composition by employing neutral compounds which produce an effective amount of acid in the photoresist film when desired. The acid may be produced from such a neutral compound by the action of heat or radiation. A thermal acid generating compound is a neutral compound which generates acid when the photoresist film is heated. A photoacid generating compound is a neutral compound which generates acid when the photoresist film is exposed to selected radiation. When the photoresist composition employs a photoacid generator the photoacid generator must be selected such that the exposing radiation wavelength used to generate acid does not cause the photobase generator in the photoresist composition to simultaneously produce a substantial amount of a base. The sensitivity of the photoacid generator, photobase generator, or both, to certain exposing radiation wavelengths may be extended by the use of conventional photosensitizers selected for their sensitivity to a particular radiation wavelength.

I have found that the selection of a strong acid, such as a sulfonic acid, is preferred. When the strong acid is employed directly in the photoresist composition containing a polymer emulsion, however; the acid may not associate with the polymer emulsion unless the acid has a hydrophobic portion. For this reason I have found that strong acids containing hydrophobic portions, such as for example dodecylbenzenesulfonic acid (DDBSA), are particularly effective when an acid is used directly in an electrodepositable photoresist composition containing a polymer emulsion.

A thermal acid generator is a compound which is not an acid but which is converted to an acid upon heating of the photoresist film. Suitable thermal acid generators useful in the present invention include the ammonium salts of acids where the corresponding amine is volatile. Ammonium salts of acids are prepared by neutralizing an acid with ammonia or an amine. The amine may be a primary, secondary or tertiary amine. The amine must be volatile since it must evaporate from the photoresist film upon heating to the temperature required to crosslink the film. When the amine or ammonia evaporates from the photoresist film upon heating it leaves an acid in the film. This acid is then present in the photoresist film and is employed to catalyze the acid hardening crosslinking reaction upon heating, unless it becomes neutralized by a corresponding amount of a base. Suitable thermal acid generators include benzoin tosylate, 2-nitrobenzyl tosylate and the alkyl esters of organic sulfonic acids. When benzoin tosylate is heated toluene sulfonic acid is produced by a substitution reaction. Alkyl sulfonates which produce the sulfonic acid by elimination upon heating are also suitable thermal acid generators.

If a photoacid generator is employed in the photoresist composition, the photoacid generator must be selected to generate an acid at exposing wavelengths which do not cause the photobase generator to produce a substantial amount of a base. When such a photoacid generator is used, the photoresist film will require two exposing steps: one selective imagewise exposure to generate a base in selected portions of the photoresist film, and a flood exposure step at a different wavelength to generate an acid in the entire photoresist film. The acid generated in the photoresist film will be neutralized by the base, generated by the photobase generator, in the film areas which are exposed during the imaging exposure step, and will therefore not be able to catalyze a crosslinking reaction in the selectively imagewise exposed portions of the photoresist film, while the acid generated in the photoresist film areas not exposed during the imagewise exposure step will not be neutralized by the photochemically generated base and will catalyze the acid hardening crosslinking reaction in those portions of the photoresist film upon heating the film. The photoacid generators which are suitable in the photosensitive coating composition of the invention are neutral compounds or mixtures of compounds that are converted to an acid, preferably a strong acid, such as for example a sulfonic acid, upon exposure of the photoresist film. A number of photo-acid generators have been found to be useful in the practice of this invention such as for example benzoin tosylate and halogenated organic compounds such as for example, tris (2,3-dibromopropyl) isocyanurate. Photoacid generators which are esters of naphthoquinone diazide sulfonic acids may also be used. Suitable naphthoquinone diazides and polymers of this type which are suitable in the present invention are disclosed in the following U.S. patents: U.S. Pat. Nos. 2,766,118; 2,767,092; 3,046,118; 3,046,121; 3,148,983; 3,201,239; 3,635,709; 3,640,992; 3,666,473; 3,759,711; 3,785,825; and 4,308,368. All these naphthoquinone diazides and polymers generate indenecarboxylic acids by the Wolff rearrangement reaction described in detail in *Photoresist Material and Processing*, W. J. DeForest, McGraw Hill; (1975), pages 49–54, and *Light Sensitive Systems*, J. Kosar, J. Wiley and Sons (1965), pages 343–351.

I have found that photosensitizers may optionally be incorporated into the photoresist composition to extend the sensitivity of the photoresist film to exposing radiation wavelengths which the photobase generator or photoacid generator, or both, are either not sensitive to, or to which either or both photogenerating compounds are not as sensitive as desired for the specific process to be used. Examples of preferred sensitizers which can be used to extend the sensitivity of the photoresist film to 365 nanometers exposing radiation include: 2-chlorothioxanthone; 9-methylanthracene; benzanthrone; perylene; benzil; 2-isopropylthiox-anthone; and phenothiazine. Other suitable photosensitizers include:

| | |
|---|---|
| propiophenone | 1-cyanonaphthalene |
| Xanthone | 1,4-dicyanonaphthalene |
| 1,3,5-Triacetylbenzene | 2-methoxynaphthalene |
| 1,3-Diphenyl-2-propanone | phenanthrene |
| Benzaldehyde | pyrene |
| Triphenylmethyl phenyl ketone | trans-stilbene |
| 1,2-Dibenzoylbenzene | triphenylene |
| 4,4'-Dichlorobenzonphenone | 2-chlorothioxanthone |
| 4-Cyanobenzophenone | 9-methylanthracene |
| Biphenyl | benzanthrone-perylene |
| Thioxanthone | benzil |
| Anthraquinone | 2-isopropylthioxanthone |
| Phenanthrene | phenothiazine |
| Ethyl phenylglyoxalate | |
| 2,6-Naphthalene disulfonic acid disodium salt | |
| 2-Naphthaldehyde | |
| 1-Naphthaldehyde | |
| 5,12-Naphthacenequinone | |
| Biacetyl | |
| Acetylpropionyl | |
| Fluorenone | |
| 1,2,5,6-Dibenzanthracene | |
| 1,2,3,4-Dibenzanthracene | |
| acetophenone | |
| 4-methoxyacetophenone | |
| anthracence | |
| 9,10-dicyanoanthracene | |
| 2,6,9,10-tetracyanoanthracene | |
| 1,4-dicyanobenzene | |
| methyl 4-cyanobenzoate | |
| methyl benzoate | |
| benzophenone | |
| chloranil | |
| chrysene | |
| fluorene | |
| naphthalene | |

Photobase generators such as 2-nitrobenzyl carbamates are sensitive to deep UV (less than about 300 nanometers) but have essentially no sensitivity to 365 nanometer radiation.

The selection of a photobase generator for use in the photoresist composition is a critical aspect of the invention. A photobase generator is a neutral compound which produces a base upon exposure to selected radiation. Suitable photobase generators which may be used are those which produce an amine base upon exposure and include, for example: benzyl carbamates of the structure

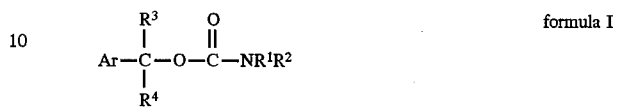

formula I where $R^1$=H or alkyl group (as described below);

$R^2$=alkyl or aryl group (as described below);

$R^3$, $R^4$=alkyl, substituted alkyl, aryl or substituted aryl group; and

Ar--aryl group;

Carbamates of the structure

formula II where $R^1$=H or alkyl group (as described below);

$R^2$=alkyl or aryl group (as described below); and $R^3$=alkyl, substituted alkyl, aryl or substituted aryl group;

Benzoin carbamates (2-oxo-1,2-diphenyithyl carbamates) of the structure

formula III where $R^1$=H or alkyl group (as described below);

$R^2$=alkyl or aryl group (as described below); and

Ar=aryl or substituted aryl group;

O-carbamoylhydroxylamines of the structure

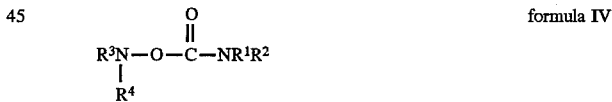

formula IV where $R^1$=H or alkyl group (as described below);

$R^2$=alkyl or aryl group (as described below); and $R^3$, $R^4$=H, alkyl, substituted alkyl, aryl, substituted aryl, or acyl group;

O-Carbamoyloximes of the structure

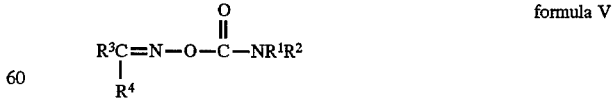

formula V where $R^1$=H or alkyl group (as described below);

$R^2$=alkyl or aryl group (as described below); and $R^3$, $R^4$=H, alkyl, substituted alkyl, aryl, or substituted aryl group;

Aromatic sulfonamides of the structure

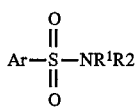
formula VI where

R$^1$=H or alkyl group (as described below);

R$^2$=alkyl or aryl group (as described below); and

Ar=aryl group; or substituted aryl groups alpha-Lactones of the structure

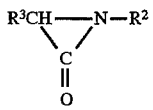
formula VII where

R$^2$=alkyl, aryl group (as described below);

R$^3$=alkyl, substituted alkyl, aryl, or substituted aryl group;

N - (2-Arylethenyl)amides of the structure

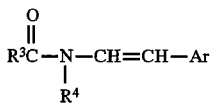
formula VIII where

R$^3$=alkyl, substituted alkyl, aryl, or substituted aryl group;

R$^4$=alkyl or substituted alkyl group; and

Ar=aryl group;

Azides of the structure

 ArN$_3$
formula IX where

Ar=aryl or substituted aryl group; and

Amides of the structure

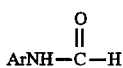
formula X where

Ar is an aryl or substituted aryl group.

In all the above structural formulas: R$^1$ is H, an alkyl group or a substituted alkyl group; and R$^2$ is an alkyl group, substituted alkyl group, an aromatic group, or an substituted aromatic group.

The photobase generator should not contain amine substituents with a pKa of greater than about 3. In addition, the combined mass of R$^1$ and R$^2$ must be sufficient to prevent substantial loss of the photochemically generated amine by evaporation during the heating step.

Polymeric materials incorporating the compounds described above are also useful as photobase generators. Polyurethanes, are examples of such polymers.

Preferred photobase generators are 2-nitrobenzyl carbamates of formula I where the aromatic group is a 2-nitrobenzyl group; benzoin carbamates of formula III where the R$^1$=H, R$^2$=C$_6$ to C$_{10}$ alkyl group and Ar=phenyl; and O-carbamolhydroxphthalamides of formula IV where R$^1$=H, R$^2$=C$_6$ to C$_{10}$ alkyl group and R$^3$, R$^4$ are a phthalyl group The concentration of each of the photoresist components, as a weight percentage based on the weight of the film forming polymer or polymer mixture, when a separate crosslinker is employed, is described in Table 1.

TABLE 1

| Component | Concentration of Photoresist components (weight % on Polymer) | | |
|---|---|---|---|
| | Overall | Preferred | Most Preferred |
| Crosslinker | 5 to 80 | 5 to 40 | 5 to 20 |
| Photobase Generator | 0.4 to 20 | 1 to 10 | 2 to 8 |
| Acid or Acid Generator | 0.04 to 5 | 0.05 to 3 | 0.1 to 2 |
| Photosensitizer | 0 to 10 | 0 to 8 | 0 to 5 |

The film forming polymer or polymer mixture, crosslinker, photobase generator, acid or acid generator, and optional photosensitizer are formulated in a liquid as a solution or as a dispersion. The concentration of the film forming polymer or polymer mixture in the liquid is typically is in the range of from about 5 to about 50 weight percent solids.

The liquids which can be used to formulate the photoresist composition include typical non-reacting solvents, such as for example: glycol ethers, such as ethylene glycol monomethylether, ethylene glycol monoethylether, Propasol B and P and the like; Cellosolve esters, such as methyl Cellosolve acetate, ethyl Cellosolve acetate and the acetates of Propasol B and P, and the like; aromatic hydrocarbons; such as toluene, xylene and the like; ketones, such as methylethyl ketone, cyclopentanone, cyclohexanone and the like; esters, such as ethyl acetate, butyl acetate, isobutyl isobutyrate, butyrolactone and the like; amides, such as dimethyl acetamide (DMAC), N-methyl pyrrolidone (NMP), dimethyl formamide (DMF) and the like; chlorinated hydrocarbons, such as ethylene dichloride, chlorobenzene, ortho-dichlorobenzene and the like; nitrobenzene; dimethylsulfoxide; and mixtures of the above. These mixtures containing minor amounts of other suitable compounds are also useful solvent systems.

In an alternate embodiment of the invention the photoresist composition may be deposited as a photoresist film onto a conductive substrate surface by anaphoretic electrodeposition. In this embodiment it is preferred that the photoresist composition be prepared as an aqueous emulsion. In this electrodeposition embodiment it is essential that the film forming polymer contain pendant carrier groups. A portion of these carrier groups must be negatively charged for the electrodeposition of the photoresist film from the photoresist composition. Suitable charged carrier groups which are incorporated onto the film forming polymer include carboxylic acids which are converted to the negatively charged carboxylate salts by the reaction with a volatile base such as for example ammonia or a volatile amine. During electrodeposition the charged carrier groups which have been neutralized by the added base are reprotonated. In the case where a sulfonic acid is employed as the acid catalyst, the acid will become neutralized with the base forming a salt, such as for example an ammonium salt, and this salt then operates as a thermal acid generator for the subsequent acid catalyzed crosslinking reaction when the photoresist film is heated.

The film forming polymer may be modified to incorporate pendant carrier groups as described in my prior U.S. Pat. No. 4,592,816, the disclosure of which is hereby incorporated by reference herein. It is essential, however, that at least one polymer must contain at least 50 to about 350 milliequivalents of carrier groups per 100 grams of the polymer or polymer mixture for the photoresist composition to be water dispersible and electrodepositable. If an aqueous solution is desired to be used in processing (developing) the deposited photoresist film, typically only a portion of the total number of carrier groups on the polymer or polymer mixture need be charged. In this regard it is generally unnecessary for all the carrier groups on the polymer or polymer mixture to be charged, and preferably less than about 80 percent of the carrier groups is typically required to be charged, provided that a minimum concentration of at least about 50 milliequivalents charged carrier groups are present for electrodeposition.

The photoresist composition of the present invention may be processed in a manner similar to a negative acting acid hardening photoresist. After the photoresist composition is deposited as a uniform photoresist film on a substrate, as by conventional spin coating or by electrodeposition, portions of the film are imagewise exposed to actinic radiation through a positive photomask. The exposed portions of the film contain the photochemically generated base and insufficient acid to catalyze the crosslinking reaction. Acid is then generated in the photoresist film by flood exposing the film, in the case of a photoacid generator, or by heating the film, as in the case of a thermal acid generator.

When a thermal acid generator is employed in the photoresist composition, the entire photoresist film is then heated to a temperature which is sufficiently high to generate acid in the photoresist film and catalyze the crosslinking reaction in the unexposed portions of the film. The acid which is generated in imagewise exposed portions of the photoresist film is neutralized by the photogenerated base in those portions. Accordingly when the photoresist film is heated no significant crosslinking occurs in the imagewise exposed portions of the photoresist film. The exposed, non-crosslinked crosslinked portions are then removed from the substrate surface by the action of a developing solution leaving a crosslinked positive image on the substrate surface.

When a photoacid generator is employed in the photoresist composition, the entire photoresist film is flood exposed to actinic radiation which generates acid in the photoresist film. As in the case of the thermal acid generator, the portions of the photoresist film which are, or have been, imagewise exposed to a different exposing radiation wavelength contain the photochemically generated base. This base neutralizes the photochemically generated acid. Therefore, upon heating the film, only those portions of the photoresist film which had not been imagewise exposed to the photobase sensitive radiation become crosslinked leaving the imagewise exposed portions for selective removal by the developer solution thereby forming a positive, crosslinked image on the substrate surface after development.

It is also possible to reverse the order of the exposing steps when photoacid and photobase generators are used, to form a crosslinked positive image. In this sequence flood exposure of the film generating acid in the photoresist film is followed by a selective imagewise exposure of the photoresist film to the photobase sensitive radiation. This is followed by heating the entire photoresist film to crosslink those portions of the photoresist film not containing the photochemically generated base. Since acid is generated in this sequence before the base is generated, this sequence is less preferred as crosslinking may begin to occur indiscriminantly in those portions of the photoresist film which contain the acid.

The following examples illustrate the preparation and processes of using the photoresist compositions of the present invention. These examples are illustrative only and are not intended to, nor should they be construed as, limiting the scope of the invention as permutations and other modifications thereto should be apparent to those having ordinary skill in this art from the disclosure of the present invention. All percentages are on a weight basis unless otherwise specified.

EXAMPLE 1

Preparation of Polymer A

A three liter, four neck, round bottom flask fitted with a mechanical stirrer, reflux condenser, thermometer and nitrogen sparge, which was sealed using an oil bubbler to permit gas to escape, was flushed with nitrogen gas for fifteen minutes and then charged with 50.0 grams 2-hydroxyethyl methacrylate, 64.0 grams methyl methacrylate, 86.0 grams butyl methacrylate, 2.0 grams of t-butyl peroctoate free radical initiator and 200 grams of 1-Methoxy-2-propanol solvent. The reaction mixture was sparged with nitrogen for 15 minutes. The flask was then heated using a heating mantle on a Jack-o-Matic® adjusted to withdraw the mantle when the temperature of the reaction mixture reached 105 degrees Celsius. The reaction mixture was maintained at a temperature of 105 degrees Celsius for about 15 minutes. The exothermic polymerization reaction raised the temperature of the reaction mixture to boiling (117 degrees Celsius). The reaction mixture gradually cooled to 105 degrees Celsius and was then held at that temperature. One hour after the exotherm occurred 0.20 grams of t-butyl peroctoate was added and the reaction temperature was held at 105 degrees Celsius for 30 minutes. At the end of this period another 0.20 grams of t-butyl peroctoate was added. After another 30 minutes at 105 degrees Celsius the reaction mixture was cooled to 60 degrees Celsius and then the reaction mixture was poured from the reaction flask. The product was 51 percent solids indicating that essentially all the monomers were converted to a polymer having the composition 25% 2-hydroxyethyl methacrylate (HEMA), 32% methyl methacrylate (MMA) and 43% butyl methacrylate (BMA) by weight.

EXAMPLE 2

Preparation of Polymer B

To a two liter, four neck, round bottom flask fitted with a mechanical stirrer, reflux condenser, thermometer and nitrogen sparge and sealed using an oil bubbler to permit the gas to escape was added 10% by weight of a monomer mixture of 75.0 grams methacrylic acid, (MAA) 125.0 grams 2-hydroxyethyl methacrylate, 60.0 grams methyl methacrylate and 240.0 grams butyl methacrylate along with 10% by weight of an initiator solution of 5.0 grams t-butyl peroctoate in 45.0 grams propylene glycol monomethyl ether ("PM") with an additional 455 grams PM. The reaction mixture was sparged with nitrogen for 15 minutes. The flask was then heated to 105 degrees Celsius using a heating mantle on a Jack-O-Matic adjusted to withdraw the mantle when the reaction mixture reached 105 degrees Celsius. The reaction mixture was maintained at 105 degrees Celsius with stirring for the remainder of the reaction. After 15 minutes the remainder of the monomer mixture and initiator solution was metered into the reaction flask over 4 hours. Twenty minutes after the monomer mixture and initiator solution were added 1.0 grams of t-butyl peroctoate was added to the reaction mixture. Twenty minutes later an additional 1.0 grams of t-butyl peroctoate was added. Thirty minutes later the reaction mixture was cooled to about 80 degrees Celsius and then poured from the flask. The solids content of the reaction product was 53% indicating that essentially all the monomers were converted to a polymer having the composition 15% methacrylic acid, 25% 2-hydroxy-ethyl methacrylate, 12% methyl methacrylate and 48% butyl methacrylate.

EXAMPLE 3

Preparation of 2-Nitrobenzyl Cyclohexylcarbamate

To a 50 milliliter dried pear shaped flask fitted with a condenser, thermometer and septum which had been purged with nitrogen for 5 minutes was added 2.5 grams cyclohexylisocyanate, 3.1 grams 2-Nitrobenzyl alcohol and 10 milliliters toluene. The reactor was maintained under a nitrogen blanket and stirred with a magnetic stirring bar. The reaction mixture temperature was increased to 110 degrees Celsius over 1 hour. The progress of the reaction was measured by thin layer chromatography (EM Associates silica gel 60 F-254,0.25 mm thick) eluted with ethyl acetate/hexane(30/70 volume ratio). The reaction was held at about 110 to 120 degrees Celsius for an additional hour. The TLC showed that some of the 2-nitrobenzyl alcohol remained, so 0.50 grams more of the cyclohexylisocyanate was added. One hour later after this addition 10 milliliters of toluene was added to the reaction flask and the contents were then immediately poured into a beaker and cooled to room temperature over about 30 minutes. White crystals formed as the reaction mixture cooled. The beaker was then cooled in an ice bath for about 15 minutes and filtered under vacuum. The crystals were dried under house vacuum at about 100 degrees Celsius for 1 hour and then weighed. The reaction yielded 5.3 grams of 2-nitrobenzyl cyclohexylcarbamate.

EXAMPLE 4

Preparation of Positive Photoresist Composition

A positive photoresist composition was prepared from 4.0 grams Solution Polymer A, 0.43 grams of distilled Cymel 300 melamine crosslinker, 1 milligram dodecylbenzenesulfonic acid, 10 milligrams 2-nitobenzyl cyclohexylcarbamate (Example 3) and 1.0 grams 1,2-dimethoxyethane solvent ("DME").

The photoresist composition was prepared as follows. The Cymel 300, dodecylbenzenesulfonic acid, and 2-nitrobenzyl cyclohexylcarbamate dissolved in the DME. This was mixed with the Solution Polymer A.

The photoresist composition was coated onto a silicon wafer using a drawdown bar with a 0.001 inch gap. The film was allowed to dry for 30 minutes. The thickness of the film was about 10 microns.

A photomask was prepared by placing opaque adhesive lines on a quartz plate. The lines were 40 mil and 80 mil wide. The mask was then placed on the film and the film was exposed to 254 nanometer light (1.5 mW/cm$^2$) for 5 minutes. The photoresist film was then heated by baking on a hot plate at 100 degrees Celsius for 30 seconds. The photoresist was developed with acetone at room temperature for about 1 minute with light brushing. An image which was the positive of the mask was produced. Little, if any, of the unexposed film thickness was lost.

A second film of the photoresist was prepared as described above to determine the sensitivity of the film to 365 nanometer light compared with 254 nanometer light. Part of the film was exposed to 365 nanometer light (2.0 mW/cm$^2$) for 5 minutes. Another part of the film was unexposed. The photoresist film was heated by baking on a hot plate at 100 degrees Celsius for 30 seconds. Development with acetone at room temperature for about 1 minute with light brushing removed only the portion of the film exposed to 254 nanometer light. The film exposed to 365 nm light was not removed. This result indicated that the film has little or no sensitivity to 365 nm light.

EXAMPLE 5

Photoresist Sensitized to Near UV Light

A photoresist composition was prepared from 4.3 grams Solution Polymer A, 0.41 grams distilled Cymel 300, 20 milligrams 2-nitrobenzyl cyclohexylcarbamate, 1 milligram dodecylbenzenesulfonic acid, 11 milligrams phenothiazine sensitizer and 1.1 grams 1,2-dimethoxyethane. The 2-nitrobenzyl cyclohexylcarbamate, dodecylbenzenesulfonic acid and the phenothiazine were dissolved in the DME. The polymer solution and the Cymel crosslinker were then added.

The photoresist composition was spin coated onto a 3 inch silicon wafers at 4000 rpm and dried in a fume hood at room temperature for 1 hour to yield films of 11 microns thickness. The photoresist film was exposed through a copper foil mask with 5 millimeter lines and spaces to 365 nanometer light (1.5 mW/cm$^2$) for 5 minutes. The photoresist film was then heated by baking at 100 degrees Celsius for 15 seconds on a hot plate and developed with acetone at ambient temperatures to produce a good quality positive image.

EXAMPLE 6

Photoresist Using Ammonium Dodecylbenzenesulfonate ("ADDBS") as a Thermal Acid Generator A paste of ammonium dodecylbenzenesulfonate (ADDBS) was prepared by neutralizing 1.0 grams of dodecylbenzenesulfonic acid with 0.30 milliliters of concentrated ammonium hydroxide.

A photoresist composition was prepared from 4.2 grams Solution Polymer B, 0.44 grams distilled Cymel 300, 2 milligrams ammonium dodecylbenzenesulfonate paste, 50 milligrams 2-nitrobenzyl cyclohexylcarbamate, and 1.0 milligrams 1,2-dimethoxyethane. The Cymel, ADDBS paste cyclohexylcarbamate were dissolved in the DME, then mixed with the polymer solution B.

Photoresist films were spin coated onto silicon wafers at 4000 rpm and dried for 1 hour at room temperature.

A mask was prepared from copper foil having lines and spaces 5 millimeters wide. The mask was placed on the film and the film was selectively exposed using 254 nanometer UV light (1.5 mW/cm$^2$) for 5 minutes followed by heating by baking on a hot plate at 100 degrees Celsius for 15 seconds. The photoresist film was developed with 1.0 Normal NaOH for 10 seconds producing a good quality positive image.

EXAMPLE 7

Photoresist Employing a Photoacid Generator

This example demonstrates the use of a photoacid generator as the source of acid for the positive photoresist. A photoresist was prepared from the following :2.0 grams polymer solution (in diglyme (bis 2-meth-oxyethyl ether) prepared according to the procedure of Example 2 from 100 grams of MAA, 50 grams HEMA, and 350 grams MMA (49% solids)), 0.10 grams Cymel 300, 0.072 grams benzoin cyclohexyl-carbamate, 0.015 grams tris(2,3-dibromopropyl) isocyanurate, 8 milli-grams of phenol-thiazine and 3.0 grams of diglyme. The photoresist solution was spin coated onto a silicon wafer at 4,000 rpm and baked for 60 sec. on a hot plate at 80° C. to remove the residual solvent. The film thickness was 1.2 microns. The film was exposed to deep UV (Hybrid Technologies Group, Inc., Series 80 exposure unit, 37 mJ/sq cm at about 254 nanometers) through a mask. It was then flood exposed to near UV (Blak-Ray XX15, 150 mJ/sq cm at about 365 nanometers) and baked on a hot plate at 130° C for 105 seconds. The photoresist was developed with 0.05N sodium hydroxide for 70 seconds producing a good quality positive image.

EXAMPLE 8

Electrodeposited Positive Photoresist

A photoresist emulsion was prepared from the following: 16.0 grams of a polymer solution (in DME prepared according to the procedure of Example 2 from 75 grams, 125 grams HEMA, 25 grams MMA, 275 grams butylacrylate (BA) (52.8% solids)), 3.0 grams Cymel 1130, 0.20 grams 2-nitrobenzyl cyclohexylcarbamate, 0.20 grams 2-isopropylthioxanthone (photosensitizer), 0.08 g Ero Blue Dye, 2:0 grams DME, 1.0 grams of 1.0% aqueous solution of dodecylbenzene sulfonic acid ("DDBSA"), 0.24 milliliters concentrated ammonium hydroxide, and 77.3 grams Deionized Water.

The 2-nitrobenzyl cyclohexylcarbamate, 2-isopropylthioxanthone, Cymel 1130 and the dye were dissolved in the DME. The polymer and DDBSA solution was then added to the DME solution and mixed. The ammonium hydroxide was then added to the mixture. The deionized water was added slowly with mixing to form the photoresist emulsion.

A photoresist film was electrodeposited from the above photoresist emulsion on a double sided circuit board material 1.5×4×1/16 inch with 0.040 inch plated through holes. The circuit board was immersed in the photoresist emulsion to a depth of 1.75 inches. Electrodeposition was carried out at 100 Volts to give a 9 micron thick film. The through holes were coated with photoresist. The coated circuit boards were dried at room temperature for 1 hour. Foil strips (Aluminum) were placed on each side of the sample which cover the through holes. Each side of the sample was exposed to 365 nanometer light(1.4 mW/cm$^2$) for 3.75 minutes, baked in a forced air oven at 120 degrees Celsius for 6.5 minutes and developed in 0.02 Normal NaOH at room temperature for 1 minute. Good quality positive resist images were formed and the resist in the through holes remained intact.

EXAMPLE 9

Photoresist sensitive to Electron Beam Exposure

A paste of ammonium p-toluenesulfonate was prepared by neutralizing 1.0 grams of p-toluenesulfonic acid with 0.40 grams of concentrated aqueous ammonium hydroxide. A photoresist composition was prepared from 2.1 grams poly (vinylphenol) (Maruzen M), 0.20 grams distilled Cymel 300, 0.15 grams benzoin cyclohexylcarbamate, 8 milligrams of ammonium p-toluenesulfonate paste, and 6.0 grams of diglyme. A photoresist film was spin coated onto a silicon wafer at 4000 rpm and baked on a hot plate at 80 degrees Centigrade for 60 sec to remove remaining solvent.

Seven pads measuring 0.25 inches square were exposed to electron beam radiation (10 KV) with an Electron Visions Corp. ElectonCure 30SC electron beam exposure system. The exposure energies were 2.4, 2.0, 1.6, 1.2, 0.8, 0.4, and 0.2 microcoulombs/sq cm respectively. The wafers were baked on a hot plate at 120 degrees Centigrade for 60 sec and developed with 0.10 normal sodium hydroxide at room temperature for 15 sec. The pads receiving 1.2 microcoulombs/sq cm or more were completely removed by the development. The unexposed film remained intact with a modest decrease in thickness.

What is claimed is:

1. A positive-acting photoresist composition which produces crosslinked images comprising a mixture of a film forming, polymer-containing acid hardening resin system; a photoacid generating compound; and a photobase generating compound wherein said photoacid generating compound is selected from the group consisting of benzoin tosylate and tris(2,3-dibromopropyl) isocyanurate.

2. A positive-acting photoresist composition which produces crosslinked images comprising a mixture of a film forming, polymer-containing acid hardening resin system; a photoacid generating compound; and a photobase generating compound where said film forming polymer of said acid hardening resin system and said photobase generating compound is a polyurethane.

3. A positive-acting photoresist composition which produces crosslinked images comprising a mixture of a film forming, polymer-containing acid hardening resin system; a photoacid generating compound; and a photobase generating compound wherein said film forming acid hardening resin system comprises at least one film forming polymer having a weight average molecular weight in the range of from about 3,000 to about 200,000 and wherein said film forming polymer contains pendant carrier groups.

* * * * *